United States Patent
Saint-Laurent et al.

(10) Patent No.: US 10,890,937 B2
(45) Date of Patent: Jan. 12, 2021

(54) APPARATUS AND METHODS FOR REDUCING CLOCK-UNGATING INDUCED VOLTAGE DROOP

(71) Applicant: QUALCOMM Incorporated, San Diego, CA (US)

(72) Inventors: Martin Saint-Laurent, Austin, TX (US); Lam Ho, Austin, TX (US); Carlos Andres Rodriguez Ancer, Austin, TX (US); Bhavin Shah, Cedar Park, TX (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/193,410

(22) Filed: Nov. 16, 2018

(65) Prior Publication Data

US 2019/0086946 A1    Mar. 21, 2019

Related U.S. Application Data

(62) Division of application No. 15/614,358, filed on Jun. 5, 2017, now Pat. No. 10,409,317.

(51) Int. Cl.
*G06F 1/03*    (2006.01)
*G06F 1/08*    (2006.01)
(Continued)

(52) U.S. Cl.
CPC .............. *G06F 1/0321* (2013.01); *G06F 1/08* (2013.01); *G06F 1/10* (2013.01); *G06F 1/324* (2013.01);
(Continued)

(58) Field of Classification Search
CPC . G06F 1/0321; G06F 1/08; G06F 1/10; G06F 1/3206; G06F 1/3237; G06F 1/324;
(Continued)

(56) References Cited

U.S. PATENT DOCUMENTS 6,922,111 B2    7/2005    Kurd et al.
6,988,217 B1    1/2006    Madrid et al.
(Continued)

FOREIGN PATENT DOCUMENTS

EP    2385626 A1    11/2011
WO    2017023472 A1    2/2017

OTHER PUBLICATIONS

International Search Report and Written Opinion—PCT/US2018/032314—ISA/EPO—dated Nov. 15, 2018.
(Continued)

*Primary Examiner* — Vuthe Siek
(74) *Attorney, Agent, or Firm* — Loza & Loza LLP

(57) ABSTRACT

Aspects of the disclosure are directed to reducing clock-ungating induced voltage droop by determining a maximum frequency value associated with an output clock waveform; modulating a clock frequency of the output clock waveform for a first time duration based on a first programmable mask pattern or a first Boolean function; and determining if either the first programmable mask pattern or the first Boolean function should be changed. In accordance with one aspect, a voltage droop mitigation circuit includes a control logic for receiving an input clock waveform and a clock enable signal waveform and for outputting a gated clock enable signal
(Continued)

waveform; a latch coupled to the control logic, the latch for holding a state of the gated clock enable signal waveform and a AND gate coupled to the latch, the AND gate for outputting an output clock waveform.

12 Claims, 7 Drawing Sheets

(51) Int. Cl.
    *G06F 1/3206*     (2019.01)
    *G06F 1/3237*     (2019.01)
    *G06F 1/324*     (2019.01)
    *G06F 1/10*     (2006.01)
    *H03K 3/012*     (2006.01)
    *H03K 19/00*     (2006.01)
    *H03K 5/131*     (2014.01)
    *H03K 21/40*     (2006.01)

(52) U.S. Cl.
    CPC .......... *G06F 1/3206* (2013.01); *G06F 1/3237* (2013.01); *H03K 3/012* (2013.01); *H03K 5/131* (2013.01); *H03K 19/0016* (2013.01); *H03K 21/406* (2013.01)

(58) Field of Classification Search
    CPC ........ G06F 1/03; H03K 21/406; H03K 3/012; H03K 5/131; H03K 19/0016; H03K 19/00; H03K 21/40
    See application file for complete search history.

(56) References Cited

U.S. PATENT DOCUMENTS

| | | | |
|---|---|---|---|
| 7,225,349 | B2 | 5/2007 | Tam et al. |
| 7,408,420 | B2 | 8/2008 | Wong et al. |
| 8,269,544 | B2 | 9/2012 | Greenhill et al. |
| 8,627,160 | B2 | 1/2014 | Devta-Prasanna et al. |
| 8,884,663 | B2 | 11/2014 | Kommrusch et al. |
| 9,250,910 | B2 * | 2/2016 | Hurd ........................ G06F 9/38 |
| 9,298,250 | B2 | 3/2016 | Drake et al. |
| 9,411,360 | B2 | 8/2016 | Lee et al. |
| 9,606,605 | B2 | 3/2017 | Mylius et al. |
| 2003/0112038 | A1 | 6/2003 | Naffziger et al. |
| 2009/0265677 | A1 | 10/2009 | Grise et al. |
| 2013/0227329 | A1 | 8/2013 | Leibowitz et al. |
| 2013/0271197 | A1 | 10/2013 | Sanghani et al. |
| 2016/0061889 | A1 | 3/2016 | Bawa et al. |
| 2017/0038789 | A1 | 2/2017 | Pal et al. |
| 2017/0038814 | A1 * | 2/2017 | Pal ........................ G06F 1/3237 |
| 2018/0348809 | A1 | 12/2018 | Saint-Laurent et al. |

OTHER PUBLICATIONS

Partial International Search Report—PCT/US2018/032314—ISA/EPO—dated Aug. 14, 2018.

* cited by examiner

APPARATUS AND METHODS FOR REDUCING CLOCK-UNGATING INDUCED VOLTAGE DROOP

PRIORITY CLAIM

This application is a divisional application of patent application Ser. No. 15/614,358 filed Jun. 5, 2017, the entire contents of the prior application are incorporated herein by reference as if fully set forth below in its entirety and for all applicable purposes.

TECHNICAL FIELD

This disclosure relates generally to the field of clock ungating, and, in particular, to reducing clock-ungating induced voltage droop.

BACKGROUND

In digital electronics circuit design, clock signals are used to control digital state transitions synchronously. That is, usage of clock signals facilitates digital state transitions in a predictable manner. In one aspect, advances in high speed digital electronics technology have resulted in increasingly higher clock speeds into, for example, the Gigahertz (GHz) range. One consequence of higher clock speeds is correspondingly higher power consumption (e.g., dc power consumption) by the digital circuitry.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides methods and apparatus for reducing clock-ungating induced voltage droop. Accordingly, a method for reducing clock-ungating induced voltage droop, the method including determining a maximum frequency value associated with an output clock waveform; modulating a clock frequency of the output clock waveform for a first time duration based on a first programmable mask pattern or a first Boolean function; and determining if either the first programmable mask pattern or the first Boolean function should be changed. In one example, the method further includes determining a second programmable mask pattern or a second Boolean function, wherein the second programmable mask pattern is different from the first programmable mask pattern and the second Boolean function is different from the first Boolean function. In one example, the method further includes modulating the clock frequency of the output clock waveform for a second time duration based on the second programmable mask pattern or the second Boolean function. In one example, the method further includes determining if the output clock waveform has reached the maximum frequency value. In one example, the maximum frequency is based on one or more operating specifications of one or more electronic components of a voltage droop mitigation circuit.

In one example, the steps of determining if either the first programmable mask pattern or the first Boolean function should be changed is based on whether the clock frequency has reached the maximum frequency value. In one example, the steps of the determining if either the first programmable mask pattern or the first Boolean function should be changed is based on an internal wakeup event, wherein the internal event is one of a wait for interrupt (WFI) event, a wait for event (WFE) event, or a snoop event. In one example, the steps of the determining if either the first programmable mask pattern or the first Boolean function should be changed is based on an external event, wherein the external event is one of a glitch-free multiplexer change event, a power management change event, or a software interrupt event. In one example, the steps of the determining if either the first programmable mask pattern or the first Boolean function should be changed is based on a quantity of active processor cores within a digital circuitry that includes a voltage droop mitigation circuit for reducing clock-ungating induced voltage droop, wherein the determining if either the first programmable mask pattern or the first Boolean function should be changed is based on a dynamic clock and frequency scaling (DCFS) point of one or more of the quantity of active processor cores.

Another aspect of the disclosure provides a voltage droop mitigation circuit including a clock generator for receiving an input clock waveform and a clock enable signal waveform, and for outputting a gated clock waveform; a programmable divider coupled to the clock generator, wherein the programmable divider divides a clock frequency of the gated clock waveform to generate a divided gated clock waveform; a first multiplexer coupled in series to a second multiplexer; and a control logic for controlling the first multiplexer and the second multiplexer based on the input clock waveform and the clock enable signal waveform.

In one example, the gated clock waveform is an enabled version of the input clock based on the clock enable signal waveform. In one example, an output of the programmable divider is coupled to a first input of the first multiplexer. In one example, a second input of the first multiplexer receives an inverted form of the divided gated clock waveform. In one example, the first multiplexer selects one of the first input and the second input as an output of the first multiplexer based on a first control signal from the control logic. In one example, the second multiplexer selects one of a first input of the second multiplexer or a second input of the second multiplexer as an output of the second multiplexer based on a second control signal from the control logic. In one example, the second multiplexer selects either a) the gated clock waveform or b) the divided gated clock waveform or an inverted format of the divided gated clock waveform to output as an output clock waveform.

Another aspect of the disclosure provides a voltage droop mitigation circuit including a control logic for receiving an input clock waveform and a clock enable signal waveform and for outputting a gated clock enable signal waveform; a latch coupled to the control logic, the latch for holding a state of the gated clock enable signal waveform and a AND gate coupled to the latch, the AND gate for outputting an output clock waveform. In one example the control logic includes an inverter coupled to a saturating counter, a multiplexer coupled to the saturating counter and a AND gate coupled to the multiplexer. In one example, the inverter receives the clock enable signal waveform and an output of the inverter resets the saturating counter while the clock enable is zero. In one example, the saturating counter is clocked by the input clock waveform. In one example, a programmable mask pattern is inputted to the multiplexer to enable or to disable one or more clock pulses for modifying a clock frequency of the output clock waveform as a ramp function of time for the output clock waveform.

Another aspect of the disclosure provides a voltage droop mitigation circuit including a control logic for receiving an input clock waveform and a clock enable signal waveform, and for outputting a gated clock enable signal waveform, wherein the control logic comprises a counter, a programmable Boolean function generator and a AND gate; a latch coupled to the control logic, the latch for holding a state of the gated clock enable signal waveform; and a AND gate configuration coupled to the latch, the AND gate configuration for outputting an output clock waveform. In one example, the AND gate configuration includes a NAND gate coupled in series with an inverter. In one example, the counter is clocked by the input clock waveform and receives the clock enable signal waveform. In one example, the programmable Boolean function generator is driven by the counter to enable or to disable one or more clock pulses for modifying a clock frequency to achieve a clock frequency ramp function of time for the output clock waveform. In one example, the counter includes a plurality of counter bits. In one example, an output of the programmable Boolean function generator is a combinational function of the plurality of counter bits.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Clock signals in digital electronics circuit design are used to control digital state transitions synchronously. For higher clock speeds there is correspondingly higher power consumption by the digital circuitry. Various aspects of the disclosure relate to systems and methods for reducing clock-ungating induced voltage droop. One mitigation technique for higher power consumption in high speed digital circuitry is clock gating. Clock gating is a power savings feature where clock signals may be gated (i.e., turned off and on) to assert and de-assert the clock signal towards part of the digital circuitry. When a clock enable signal is de-asserted, the clock signal is disabled and dc power consumption is reduced. When the clock enable signal is asserted, the clock signal is enabled and dc power consumption resumes to its full nominal state. The device that implements the clock enablement operation may be known as a clock gating cell (CGC) or an integrated clock gate (ICG).

Figure 1:
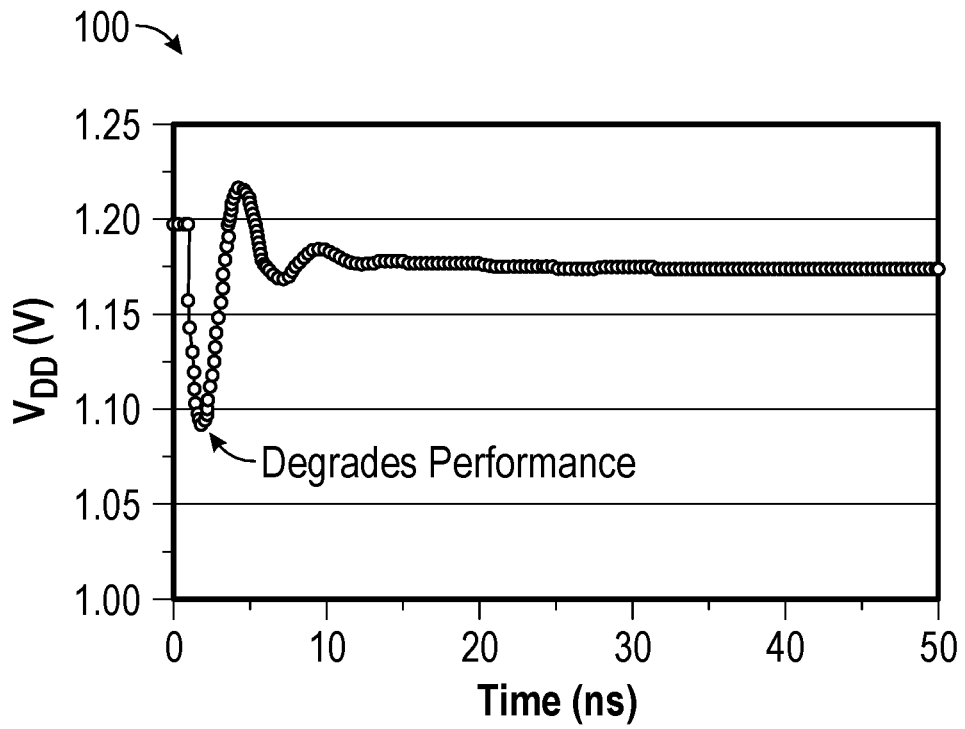
FIG. 1 illustrates an example graph of voltage droop vs. time due to clock gating.

In digital circuitry, the CGC may be designed to re-enable the clock signal quickly to full nominal frequency. However, a consequence of re-enabling the clock signal quickly to full nominal frequency is that it may induce a large voltage droop (i.e., voltage transient) due to a fast current transient associated with the fast clock signal frequency. The large voltage droop may degrade circuit performance and power efficiency. In one example, the voltage droop is proportional to the derivative of the current with respect to time, due to inductance in the digital circuitry. For example, as the current speed increases, its derivative increases and the voltage droop increases as well. For example, the voltage droop magnitude may worsen with a larger quantity of active processors in the digital circuitry. FIG. 1 illustrates an example graph 100 of voltage droop vs. time due to clock gating. As shown in FIG. 1, the y-axis represents the voltage $V_{DD}$ in volts and the x-axis represents time in nanoseconds. The voltage droop is shown on the left side of the graph 100 which an arrow indicating that such a voltage droop may degrade performance. In one example, the voltage droop is the difference between the ideal voltage (e.g., VDD=1 V) and the actual voltage (as represented by the voltage waveform in FIG. 1).

Figure 2:
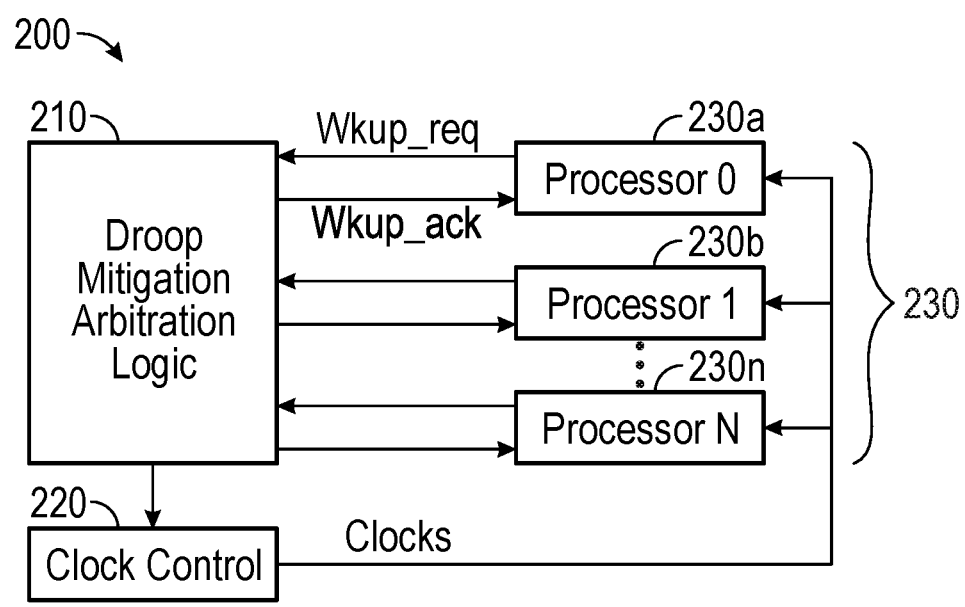
FIG. 2 illustrates an example system for employing a droop mitigation arbitration logic circuit.

In one example, a mitigation technique to reduce the voltage droop is to employ the addition of a droop mitigation arbitration logic circuit which selectively controls the assertion of clock signals to a plurality of processors. FIG. 2 illustrates an example system 200 for employing a droop mitigation arbitration logic circuit 210. The system 200 may include a clock control unit 220 and one or more processors 230 (e.g., Processor 0 (230a), Processor 1 (230b), . . . Processor N (230n)). As shown in FIG. 2, the droop mitigation arbitration logic circuit 210 is coupled to the clock control unit 220 which outputs clock signals to each of the processors 230. One example of communication exchanges between each processor 230 and the droop mitigation arbitration logic circuit 210 includes a wake up request (wkup_req) signal and a wake up acknowledgement (wkup_ack) signal.

For example, the droop mitigation arbitration logic circuit 210 may arbitrate the wakeup of each of the processor 230 to allow a maximum number of processor(s) to exit the clock gating stage in parallel. That is, there is a hand shake protocol between the droop mitigation arbitration logic circuit 210 and each of the processors 230. The droop mitigation arbitration logic circuit 210 may also control the clock control unit 220 to reduce the impact of ungating the clock signals to each of the processors 230.

For example, the droop mitigation arbitration logic circuit may sequentially activate the clock signals to only one or a few processors at a time to avoid a parallel enablement across all processors 230. The droop mitigation arbitration logic circuit 210 may also perform clock control to minimize clock ungating performance impact. In one example, processor performance may be related to the signaling overhead (e.g., handshake protocol) between the droop mitigation arbitration logic circuit 210 and each processor 230. In one example, each processor 230 may be stalled during the signaling overhead duration. In one example, effectiveness of reducing the voltage droop occurs when the architectural events are visible to an external controller, such as a wait for interrupt (WFI) signal and a wait for event (WFE) signal.

Figure 3:
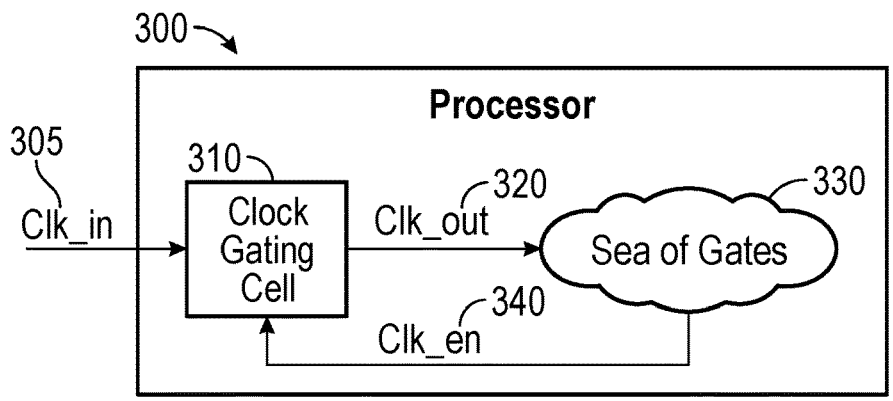
FIG. 3 illustrates an example of a clock ungating architecture within a processor.

FIG. 3 illustrates an example of a clock ungating architecture within a processor 300 which employs a clock gating cell (CGC) 310 to gate an output clock (Clk_out) 320 to a sea of gates 330 when a clock enable signal (Clk_en) 320 is de-asserted. The clock gating cell (CGC) 310 may be employed to gate the output clock (Clk_out) 320 when the clock enable signal (Clk_en) 320 is de-asserted. In one example, the clock enable signal Clk_en 340 is sourced from the sea of gates 330. In another example, the output clock Clk_out 320 is derived from an input clock Clk_in 305 to the CGC 310.

Figure 4:
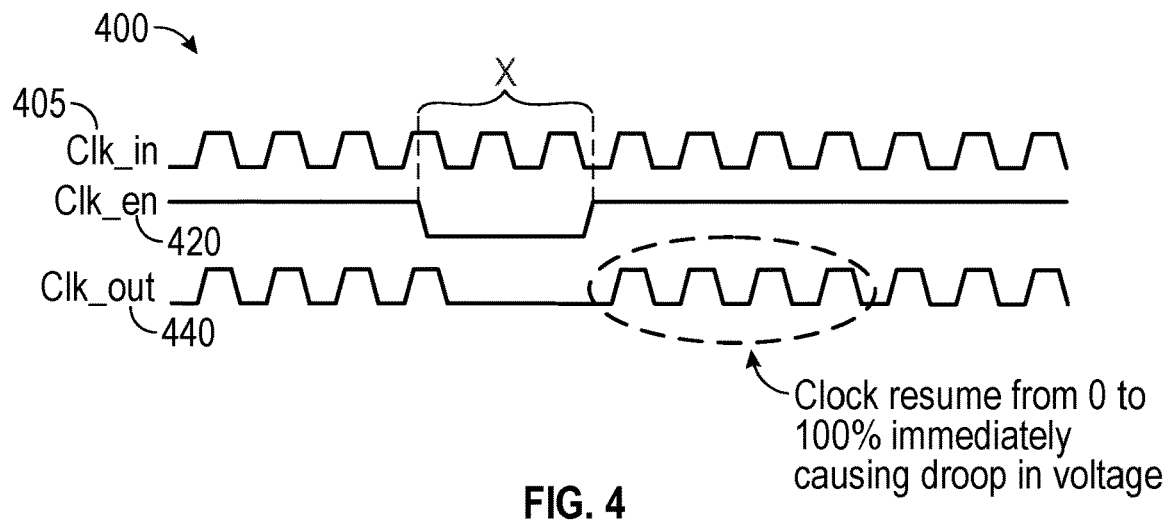
FIG. 4 illustrates an example waveform graph showing an example input clock (Clk_in) waveform, an example clock enable signal (Clk_en) waveform, and an example output clock (Clk_out) waveform.

FIG. 4 illustrates an example waveform graph 400 showing an example input clock (Clk_in) waveform 405, an example clock enable signal (Clk_en) waveform 420, and an example output clock (Clk_out) waveform 440. The example waveform graph 400 shows the clock ungating operation is triggered by the clock enable signal (Clk_en) waveform 420. As shown in FIG. 4, the input clock (Clk_in) waveform 405 is a continuous one. During the duration X when the clock enable signal (Clk_en) waveform 420 is turned OFF (i.e., de-asserted), the output clock (Clk_out) waveform 440 is a flat line. The output clock (Clk_out) waveform 440 resumes when the clock enable signal (Clk_en) waveform 420 is turned back ON (i.e., asserted). When the frequency of the output clock (Clk_out) waveform 440 resumes from 0% to 100% immediately, a voltage droop may occur due to a fast current transient. As an example, the clock gating cell (CGC) 310 (shown in FIG. 3) gates the output clock (Clk_out) 320 when the clock enable signal (Clk_en) 320 is de-asserted. When the clock enable signal (Clk_en) 320 is asserted again to 100% frequency immediately, such an abrupt change may cause the voltage droop.

Figure 5:
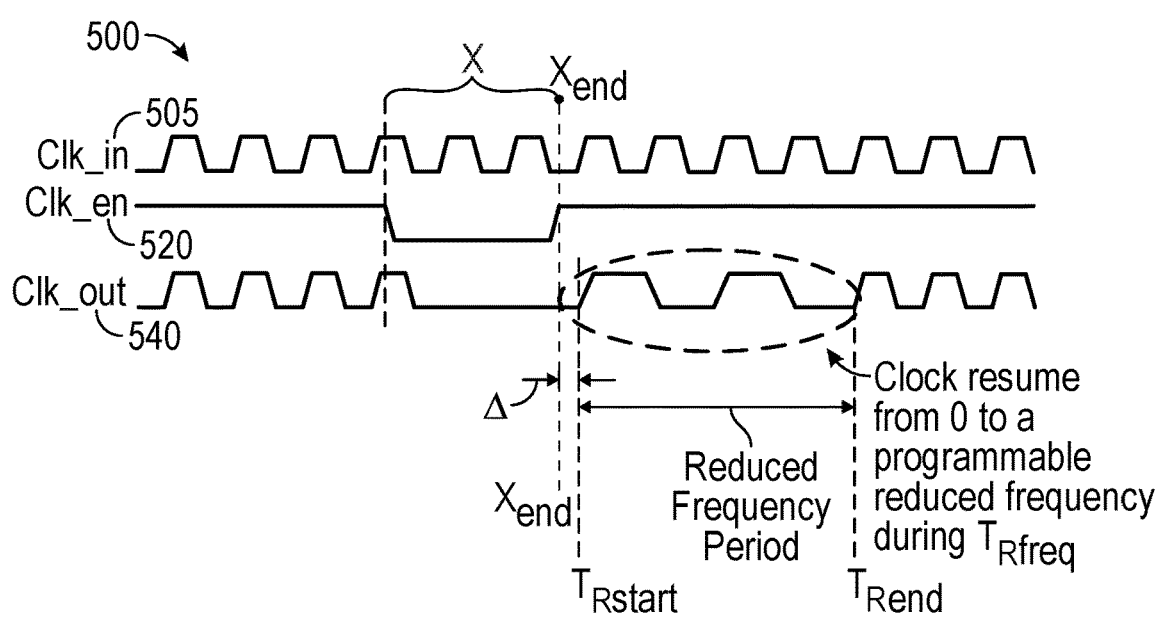
FIG. 5 illustrates an example waveform graph showing an example input clock (Clk_in) waveform, an example clock enable signal (Clk_en) waveform, and an example output clock (Clk_out) waveform with the example output clock (Clk_out) waveform being ramped from zero to a programmable reduced frequency during a reduced frequency period $T_{Rfreq}$.

In another example, the clock enable signal (Clk_en) 320 is asserted again at a reduced frequency with minimal architectural changes. FIG. 5 illustrates an example waveform graph 500 showing an example input clock (Clk_in) waveform 505, an example clock enable signal (Clk_en) waveform 520, and an example output clock (Clk_out) waveform 540 with the example output clock (Clk_out) waveform 540 being ramped from zero to a programmable reduced frequency during a reduced frequency period $T_{Rfreq}$.

As shown in FIG. 5, the input clock (Clk_in) waveform 505 is a continuous one. During the duration X when the clock enable signal (Clk_en) waveform 520 is turned OFF (i.e., de-asserted), the output clock (Clk_out) waveform 540 is a flat line. The output clock (Clk_out) waveform 540 resumes when the clock enable signal (Clk_en) waveform 520 is turned back ON (i.e., reasserted). As shown in FIG. 5, there is a delay $\Delta$ between when the clock enable signal (Clk_en) waveform 520 is turned back ON (i.e., asserted) at $X_{end}$ and when the output clock (Clk_out) waveform 540 resumes at the start of the reduced frequency period $T_{Rfreq}$. The start of the reduced frequency period $T_{Rfreq}$ is labeled as $T_{Rstart}$ in FIG. 5.

As shown in FIG. 5, the clock frequency is sequentially increased from lower frequency values to higher frequency values during the reduced frequency period $T_{Rfreq}$ until the full nominal frequency is achieved by the end of the reduced frequency period $T_{Rfreq}$. The end of the reduced frequency period $T_{Rfreq}$ is labeled as $T_{Rend}$ in FIG. 5. For example, the clock frequency may be reduced when a clock ungating condition is detected and the clock frequency may be resumed to a full frequency over the reduced frequency period $T_{Rfreq}$. In one example, no change to the microarchitecture of the existing digital circuitry is required and the same ports of a standard clock gating cell may be used.

Figure 6:
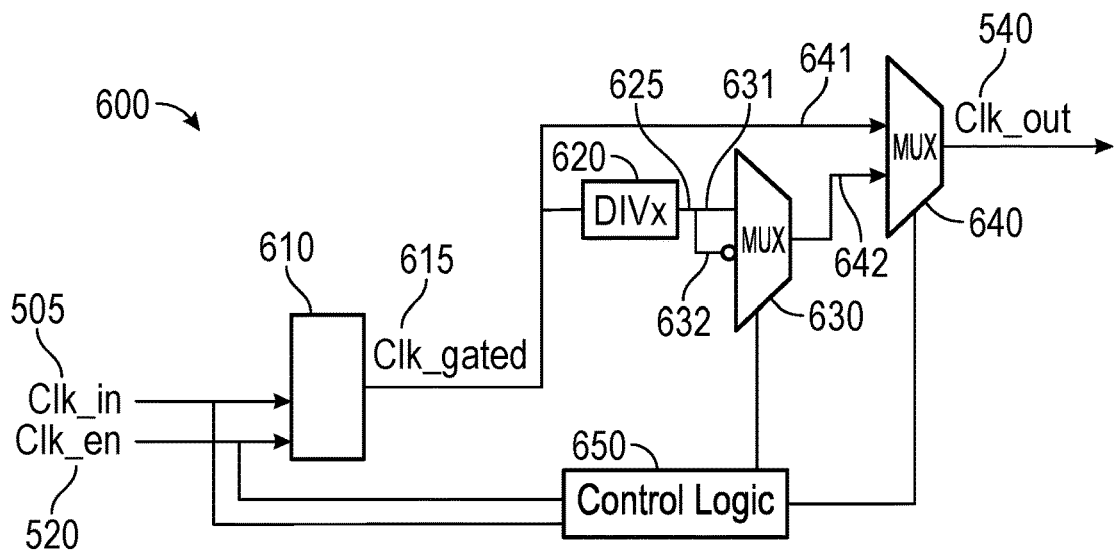
FIG. 6 illustrates an example voltage droop mitigation circuit for reducing clock-ungating induced voltage droop.

FIG. 6 illustrates an example voltage droop mitigation circuit 600 for reducing clock-ungating induced voltage droop. In one example, the voltage droop mitigation circuit 600 is part of a digital circuitry that may be applied to various electrical applications. In one example, the voltage droop mitigation circuit 600 includes a clock generator 610, a programmable divider 620, a two multiplexers 630, 640 and a control logic 650. Although two multiplexers 630, 640 are shown in a particular configuration relative to the other components of the example voltage droop mitigation circuit 600 in FIG. 6, one skilled in the art would understand that other quantities and configurations of multiplexers may be used in the example voltage droop mitigation circuit 600 without departing from the spirit and scope of the present disclosure. Although the example in FIG. 6 shows a programmable divider, a fixed (i.e., non-programmable) divider may also be used within the spirit and scope of the present disclosure.

In one aspect, the voltage droop mitigation circuit 600 may be used to employ a clock ungating technique which ramps (e.g., modulates) the clock frequency from zero (when de-asserted) to a full (100%) nominal frequency over a time period (such as during the reduced frequency period $T_{Rfreq}$) when the clock enable signal (Clk_en) waveform 520 is turned back ON (i.e., reasserted). As shown in FIG. 6, the input clock (Clk_in) waveform 505 is inputted to the voltage droop mitigation circuit 600 through the clock generator 610. Also inputted to the voltage droop mitigation circuit 600 through the clock generator 610 is the clock enable signal (Clk_en) waveform 520. Both the input clock (Clk_in) waveform 505 and the clock enable signal (Clk_en) waveform 520 are also inputted to the control logic 650. An output of the clock generator 610 is a gated clock (Clk_gated) waveform 615. In one example, the gated clock (Clk_gated) waveform 615 is an enabled version of the input clock (Clk_in) 505 based on the clock enable signal (Clk_en) waveform 520. The gated clock (Clk_gated) waveform 615 is then inputted to the programmable divider 620 and to a first input 641 of the second multiplexer 640. In one aspect, the programmable divider 620 divides (i.e., changes) the clock frequency of the gated clock (Clk_gated) waveform 615. Thus, the output of the programmable divider 620 is a divided gated clock waveform 625. In one example, the divided gated clock waveform 625 is a divided form of the gated clock (Clk_gated) waveform 615; that is, at a lower clock frequency.

The output of the programmable divider 620 is coupled to the first input 631 of the first multiplexer 630. The second input 632 of the first multiplexer 630 receives an inverted form of the divided gated clock waveform 625. And, the output of the first multiplexer 630 is coupled to a second input 642 of the second multiplexer 640. Each of the multiplexers 630, 640 selects one of its inputs as its output based on a control signal from the control logic 650. That is, the control logic 650 controls both the first multiplexer 630 and the second multiplexer 640 based on the input clock (Clk_in) waveform 505 and the clock enable signal (Clk_en) waveform 520. The output of the second multiplexer 640 is the output clock (Clk_out) waveform 540. The second multiplexer 640 selects either a) the gated clock (Clk_gated) waveform 615 or b) the divided gated clock waveform 625 or its inverted format. The selection by the second multiplexer 640 is based on the control signal from the control logic 650.

In one example, when the clock enable signal (Ck_en) waveform 520 is asserted, the divided gated clock waveform 625 may be either HIGH or LOW. In one example, the control logic 650 may select either the first input 631 or the second input 632 to ensure that the output of the first multiplexer 630 is LOW such that no additional falling edge on the output clock (Clk_out) waveform 540 would be generated when ungated. The control logic 650 may select the input 642 of the second multiplexer 640 when the gated clock (Clk_gated) waveform 615 is ungated and may continue to select input 642 of the second multiplexer 640 until the delay Δ expires and switches to input 641 of the second multiplexer 640. In one example, the delay Δ is a programmable delay.

In one example, the input clock (Clk_in) waveform 505 is at a 50% duty cycle. In one example, the output clock (Clk_out) waveform 540 is at a 50% duty cycle at a divided frequency. In another example, the duty cycle of the output clock (Clk_out) waveform 540 is greater than 50%. And, in yet another example, the duty cycle of the output clock (Clk_out) waveform 540 is less than 50%. In one example, the voltage droop mitigation circuit 600 may be employed to reduce the clock frequency to achieve a clock frequency ramp function of time (i.e., clock frequency ramp versus time).

Figure 7:
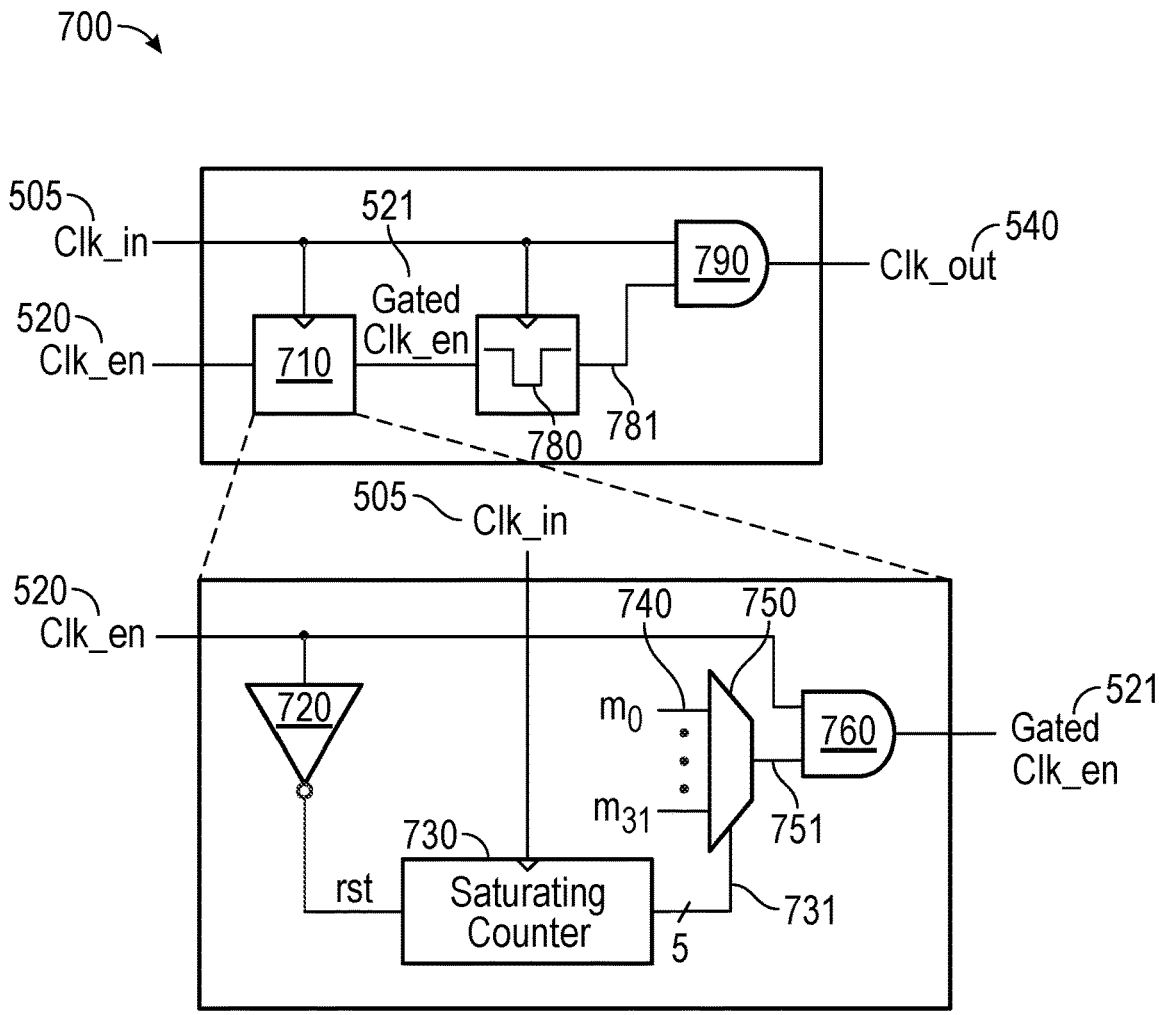
FIG. 7 illustrates an example voltage droop mitigation circuit for reducing clock-ungating induced voltage droop using a programmable mask pattern.

FIG. 7 illustrates an example voltage droop mitigation circuit 700 for reducing clock-ungating induced voltage droop using a programmable mask pattern 740. In one example, the voltage droop mitigation circuit 700 is part of a digital circuitry that may be applied to various electrical applications. In one example, the voltage droop mitigation circuit 700 includes a control logic 710, a latch 780 and a AND gate 790. In one example, an input clock (Clk_in) waveform 505 and a clock enable signal (Clk_en) waveform 520 are inputted to the voltage droop mitigation circuit 700. The output of the voltage droop mitigation circuit 700 is an output clock (Clk_out) waveform 540. As shown in FIG. 7, the input clock (Clk_in) waveform 505 is inputted to the voltage droop mitigation circuit 700 through the control logic 710, the latch 780 and the AND gate 790. The clock enable signal (Clk_en) waveform 520 is inputted to the voltage droop mitigation circuit 700 through the control logic 710.

FIG. 7 also shows an expanded view of the control logic 710. In one example, the control logic 710 includes an inverter 720, a saturating counter 730, a multiplexer 750 and a AND gate 760. In one example, the input to the saturating counter 730 includes a reset (rst) shown in FIG. 7. To avoid confusion with the AND gate 790, the AND gate within the control logic is referred to as a control logic AND gate 760. The clock enable signal (Clk_en) waveform 520 is inputted to the control logic 710 through the inverter 720 and the control logic AND gate 760. The input clock (Clk_in) waveform 505 is inputted to the control logic 710 through the saturating counter 730. The programmable mask pattern 740 is inputted to the multiplexer 750. The programmable mask pattern 740 enables or disables clock pulses which modifies the clock frequency of the output clock (Clk_out) waveform 540 as a ramp function of time. The clock pulses are pulses of the output clock (Clk_out) waveform 540. In one aspect, the programmable mask pattern 740 is dynamically selected. In another aspect, the programmable mask pattern 740 is selected a priori to usage.

In the example of the voltage droop mitigation circuit 700, the control logic 710 is added to a clock enable path. A clock input signal Clk_in serves as a first input to the AND gate 790. In addition, a latched output enable signal 781 from the latch 780 serves as a second input to the AND gate 790. The latch 780 holds state of its input. As shown in FIG. 7, the input to the latch 780 is a gated clock enable signal (Clk_en) waveform 521. The output of the AND gate 790 is the output clock (Clk_out) waveform 540. In one example, the latched output enable signal 781 is generated from its input which is the gated clock enable signal (Clk_en) waveform 521. The gated clock enable signal (Clk_en) waveform 521 is transformed from the clock enable signal (Clk_en) waveform 520 through the control logic 710.

In one example, the saturating counter 730 includes B bits and is clocked by the input clock (Clk_in) waveform 505. The output of the saturating counter 730 is a control signal 731. The control signal 731 is sent to the multiplexer 750 to select which one of N inputs of the programmable mask pattern 740 to the multiplexer 750 should be outputted by the multiplexer 750.

As shown in the example of FIG. 7, N=32 and B=5 bits. In one example, $N=2^B$. In one example, the N inputs to the multiplexer 750 is the programmable mask pattern 740 with N mask bits $m_0, m_1, m_2, \ldots, m_{N-1}$. For example, a first mask bit is denoted as $m_0$ and a last mask bit is denoted as $m_{N-1}$. In one example, the output of the multiplexer 750 is one of the N mask bits $m_0, m_1, m_2, \ldots, m_{N-1}$ from the programmable mask pattern 740. That is, the output of the multiplexer 750 may reproduce the programmable mask pattern 740 with N mask bits $m_0, m_1, m_2, \ldots, m_{N-1}$ in series (i.e., multiplexer output 751) as a function of time. In one example, the output of the multiplexer 750 repeats with a period N with the last mask bit $m_{N-1}$ followed by the first mask bit $m_0$.

The control logic 710 produces the gated clock enable signal (Clk_en) waveform 521 which is generated by the control logic AND gate 760 with input clock (Clk_in) waveform 505 as a first input and the multiplexer output 751 as a second input. That is, the multiplexer output 751 is the programmable mask pattern 740 with N mask bits $m_0$, $m_1$, $m_2$, ..., $m_{N-1}$ in series as a function of time. Thus, the output of the control logic 710 follows the programmable mask pattern 740 $m_0$, $m_1$, $m_2$, ..., $m_{N-1}$ as a function of time when the clock enable signal (Clk_en) waveform 520 is asserted HIGH. In one example, the output of the control logic 710 repeats with a period N when the clock enable signal (Clk_en) waveform 520 is asserted HIGH. As the saturating counter 730 sequentially changes state, the multiplexer 750 masks particular clock pulses by forcing to the gated clock enable signal (Clk_en) waveform 521 to zero according to the programmable mask pattern 740. In another aspect, when the clock enable signal (Clk_en) waveform 520 is LOW (i.e., de-asserted), the saturating counter 730 is reset to zero and the gated clock enable signal (Clk_en) waveform 521 is also set to zero.

In one example, if the programmable mask pattern 740 with N mask bits $m_0$, $m_1$, $m_2$, ..., $m_{N-1}$ (with N=32 and B=5 bits) is given by:

11101010 01001010 10110110 11101111, then the output clock (Clk_out) waveform 540 gradually ramps (e.g., modulates) the current demand of the digital circuitry to which the voltage droop mitigation circuit 700 is a component. In one example, the wakeup penalty is determined by the number of clock pulses that are gated off. In an example, the wakeup penalty is 12 cycles. In one example, the wakeup penalty is determined by the number of clock pulses gated off, i.e. the number of zeros in the mask pattern. As an example, the last mask bit $m_{31}$ in this example is 1 to keep gated clock enable signal (Clk_en) waveform 521 HIGH when the saturating counter 730 saturates. The duty cycle of the output clock (Clk_out) waveform 540 is in general not 50%. Although the example in FIG. 7 uses the programmable mask pattern 740, in another example, a fixed mask pattern may be used within the spirit and scope of the present disclosure. In one example, the fixed mask pattern may be a table with values for the N mask bits $m_0$, $m_1$, $m_2$, ..., $m_{N-1}$ and corresponding average current values which, for example, may be associated with estimated voltage droop values. In using the fixed mask pattern, a user may determine an estimated voltage droop value that would be tolerable for a particular application.

Figure 8:
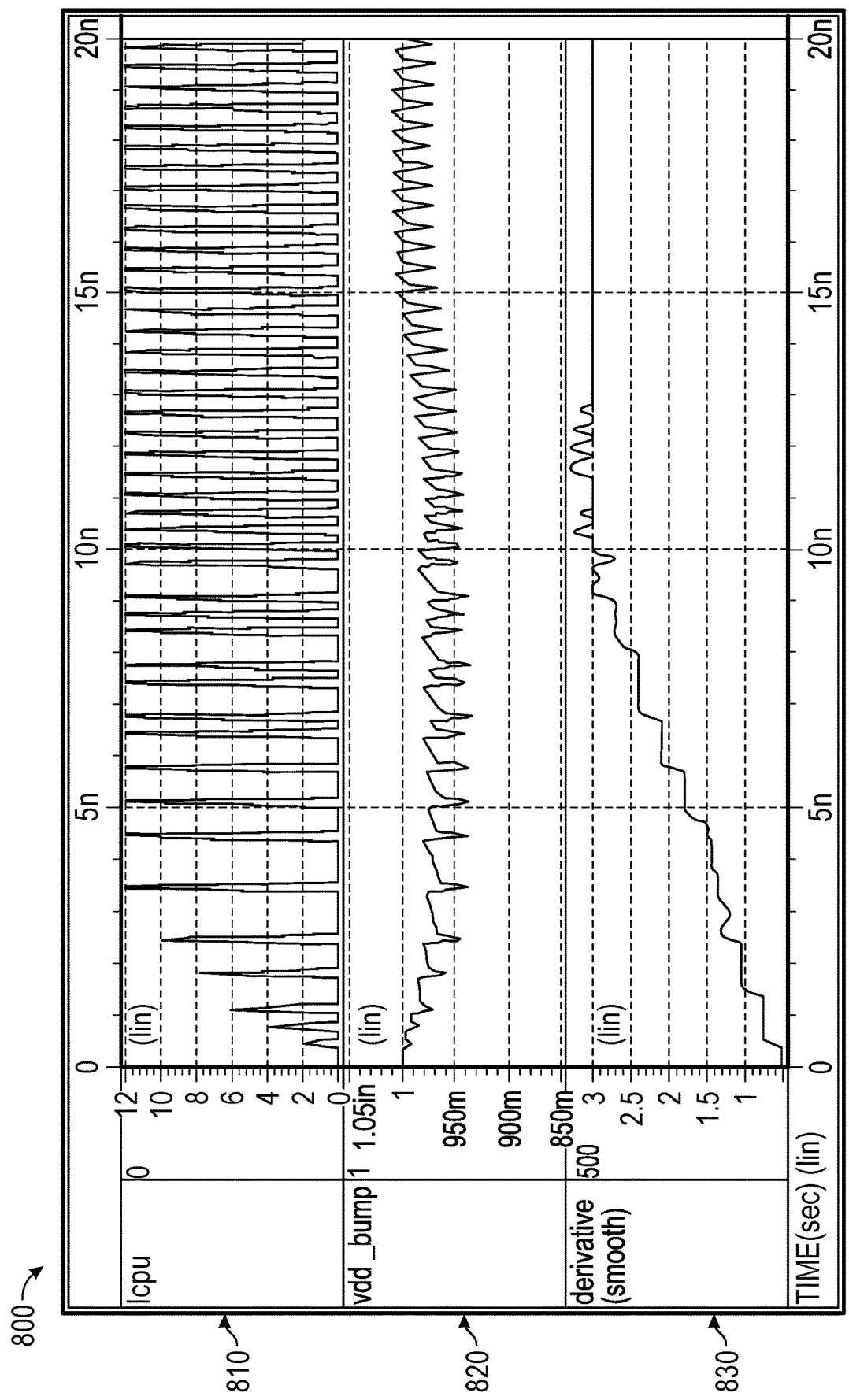
FIG. 8 illustrates an example of a three-trace graph showing three exemplary circuit waveforms as a function of time for a digital circuitry with voltage droop mitigation.

FIG. 8 illustrates an example of a three-trace graph 800 showing three exemplary circuit waveforms as a function of time for a digital circuitry with voltage droop mitigation. The upper trace 810 shows the current consumption of the digital circuitry. The y-axis of the upper trace 810 is in units of Amperes. The middle trace 920 shows the supply voltage with voltage droops of up to 65 mV. The middle trace 820 shows the supply voltage with reduced voltage droop compared to 920. In one example, the reduced voltage droop is 65 mV. The y-axis of the middle trace 820 is in units of milli-volts. The lower trace 830 shows the derivative of the current waveform 810 averaged over time. The y-axis of the upper trace 810 is in units of Amperes. The x-axis of all three traces (upper trace 810, middle trace 820 and lower trace 830) is time in units of nano seconds.

Figure 9:
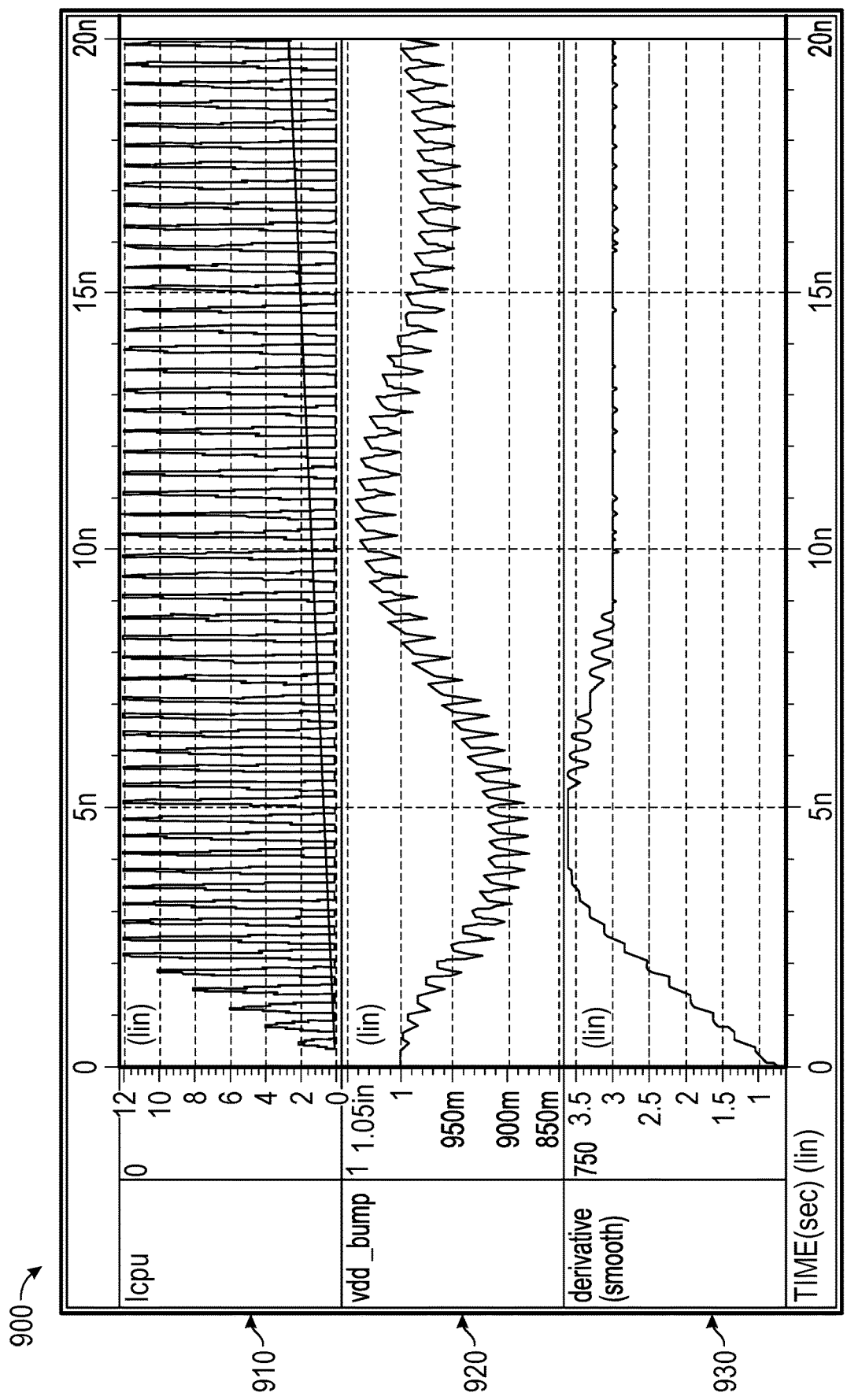
FIG. 9 illustrates an example of a three-trace graph showing three exemplary circuit waveforms as a function of time for a digital circuitry without voltage droop mitigation.

FIG. 9 illustrates an example of a three-trace graph 900 showing three exemplary circuit waveforms as a function of time for a digital circuitry without voltage droop mitigation. The upper trace 910 shows the current consumption of the digital circuitry. The y-axis of the upper trace 910 is in units of Amperes. The middle trace 920 shows the supply voltage with voltage droops of up to 119 mV. The y-axis of the middle trace 920 is in units of milli-volts. The lower trace 930 shows the derivative of the current waveform 910 averaged over time. The y-axis of the upper trace 910 is in units of Amperes. The x-axis of all three traces (upper trace 910, middle trace 920 and lower trace 930) is time in units of nano seconds.

A comparison of FIG. 8 and FIG. 9 show that by including the voltage droop mitigation circuit as disclosed herein may avoid an instantaneous frequency change on either internal wakeup events (e.g., wait for interrupt (WFI), wait for event (WFE), snoop, etc.) or external events (e.g., glitch-free multiplexer change, power management change, software interrupt, etc.). By including the voltage droop mitigation circuit, it allows external configuration signals to govern the clock frequency ramp behavior:

In one example, the programmable mask pattern 740 may be based on latency-criticality of the internal wakeup events (e.g., wait for interrupt (WFI), wait for event (WFE), snoop, etc.). For example, a shorter clock frequency ramp may be implemented in response to snoops while a longer clock frequency ramp may be implemented for WFI or WFE.

In another example, the programmable mask pattern 740 may be based on the quantity of active processor cores. That is, if a single processor core is active, the clock frequency may ramp (e.g., modulate) more quickly than if more processor cores are active.

In another example, the programmable mask pattern 740 may be based on the dynamic clock and frequency scaling (DCFS) point of the processor cores. For example, in super turbo mode, a longer clock frequency ramp is implemented. In a lower frequency mode, a shorter clock frequency ramp is implemented. That is, for example, at higher frequencies (e.g., turbo mode) the duration of the programmable mask pattern 740 may be N=32 to allow a longer clock frequency ramp. At lower frequencies the duration of the programmable mask pattern 740 may be N=24 to allow a shorter clock frequency ramp which may be acceptable from a power supply noise standpoint.

In one example, one of the external events (e.g., glitch-free multiplexer change, power management change, software interrupt, etc.) may indicate the ramp status of other processor cores. For example, perform a shorter clock frequency ramp if the other processor cores are already at full clock frequency. Or, perform a longer clock frequency ramp if multiple processor cores are turn ON simultaneously.

Figure 10:
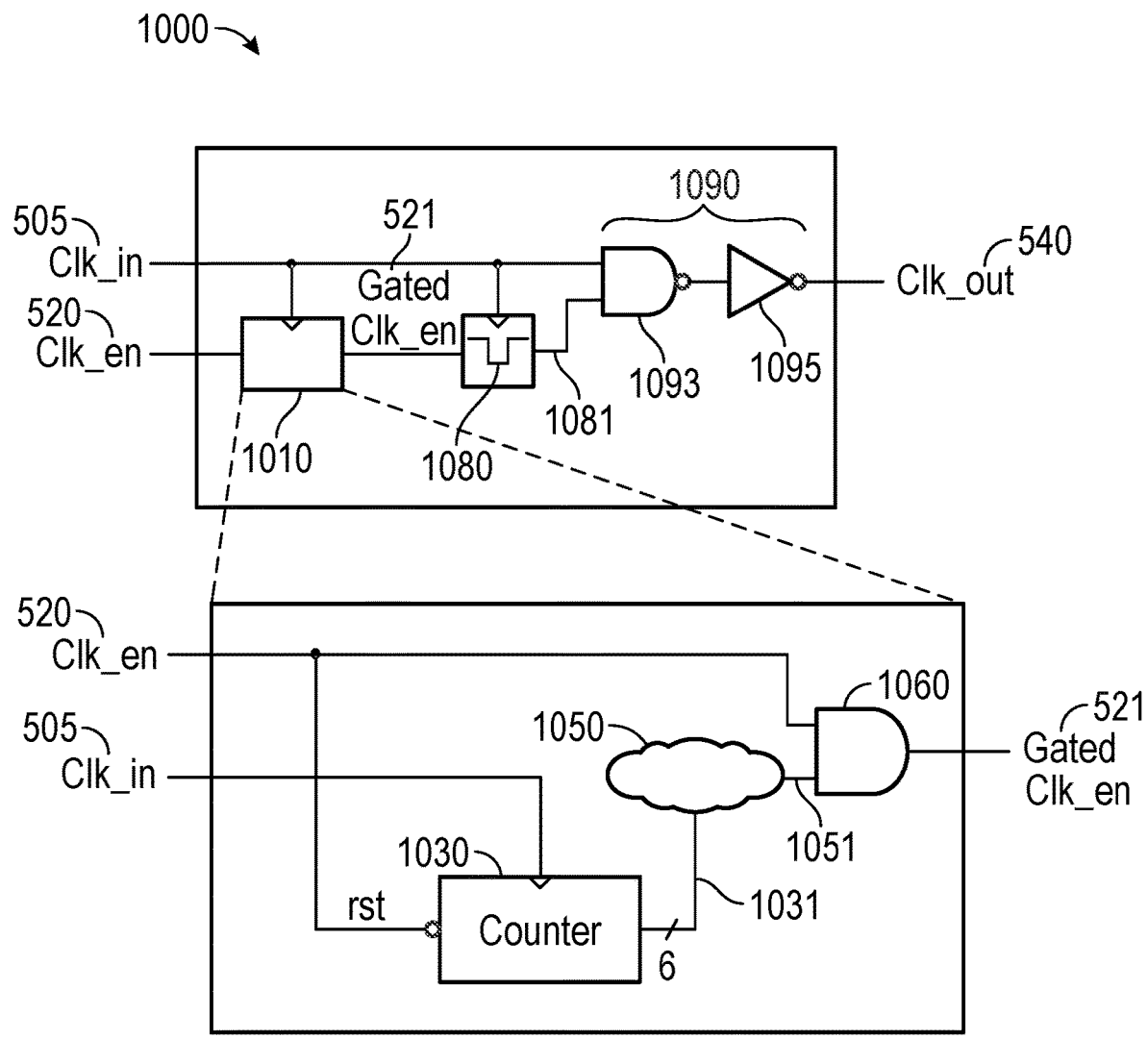
FIG. 10 illustrates an example voltage droop mitigation circuit for reducing clock-ungating induced voltage droop using a control logic with a programmable Boolean function generator.

FIG. 10 illustrates an example voltage droop mitigation circuit 1000 for reducing clock-ungating induced voltage droop using a control logic 1010 with a programmable Boolean function generator 1050. In one example, the voltage droop mitigation circuit 1000 includes a control logic 1010, a latch 1080, NAND gate 1093 in series with an inverter 1095. In another implementation, the NAND gate 1093 in series with the inverter 1095 may be replaced by a AND gate 1090. In one example, an input clock (Clk_in) waveform 505 and a clock enable signal (Clk_en) waveform 520 are inputted to the voltage droop mitigation circuit 1000. The output of the voltage droop mitigation circuit 1000 is an output clock (Clk_out) waveform 540. As shown in FIG. 10, the input clock (Clk_in) waveform 505 is inputted to the voltage droop mitigation circuit 1000 through the control logic 1010, the latch 1080 and the NAND gate 1093 in series with the inverter 1095 (i.e., AND gate 1090). The clock enable signal (Clk_en) waveform 520 is inputted to the voltage droop mitigation circuit 1000 through the control logic 1010.

FIG. 10 also shows an expanded view of the control logic 1010. In one example, the control logic 1010 includes a counter 1030, a programmable Boolean function generator 1050 and a AND gate 1060. In one example, the input to the counter 1030 includes a reset (rst) shown in FIG. 10. To avoid confusion with the AND gate 1090, the AND gate within the control logic is referred to as a control logic AND gate 1060. The clock enable signal (Clk_en) waveform 520 is inputted to the control logic 1010 through the counter 1030 and the control logic AND gate 1060. The input clock (Clk_in) waveform 505 is inputted to the control logic 1010 through the counter 1030.

As shown in FIG. 10, the programmable Boolean function generator 1050 is driven by the counter 1030 to enable or disable clock pulses which modifies (e.g., reduces) the clock frequency to achieve a clock frequency ramp function of time (i.e., clock frequency ramp versus time). In one example, the counter 1030 is an N bit counter.

As shown in FIG. 10, the input clock (Clk_in) waveform 505 serves as a first input to a NAND gate 1093. In addition, a latched output enable signal 1081 from the latch 1080 serves as a second input to the NAND gate 1093. The latch 1080 holds state of its input. As shown in FIG. 10, the input to the latch 1080 is a gated clock enable signal (Clk_en) waveform 521. The output of the inverter 1095 which is in series to the NAND gate 1093 is the output clock (Clk_out) waveform 540. In one example, the latched output enable signal 1081 is generated from its input which is the gated clock enable signal (Clk_en) waveform 521.

The gated clock enable signal (Clk_en) waveform 521 is transformed from the clock enable signal (Clk_en) waveform 520 through the control logic 1010. The transformation from the clock enable signal (Clk_en) waveform 520 to the gated clock enable signal (Clk_en) waveform 521 uses the counter 1030, the programmable Boolean function generator 1050 and the AND gate 1060. In one example, the counter 1030 has B bits and is clocked by the input clock (Clk_in) waveform 505. For example, the number of counter states for the counter 1030 is $N=2^B$. In one example, B=6 produces a 6 bit counter, and $N=2^6=64$ states. In one example, the output of the counter 1030 is inputted to the programmable Boolean function generator 1050 which generates the gated clock enable signal (Clk_en) waveform 521. In one example, gated clock enable signal (Clk_en) waveform 521 is then inputted to the latch 1080 to produce the latched output enable signal 1081.

The counter 1030 may be synchronously reset to zero when the clock enable signal (Clk_en) waveform 520 is de-asserted (i.e., set to LOW). Then, when the clock enable signal (Clk_en) waveform 520 is asserted (i.e., set to HIGH), the counter 1030 starts incrementing its state from zero to $2^{N-1}$. In one example, the counter 1030 saturates at a maximum state of $2^{N-1}$. In one aspect, the counter 1030 increments synchronously with the input clock (Clk_in) waveform 505. The output of the counter 1030 may be sent to the programmable Boolean function generator 1050. In one example, the programmable Boolean function generator 1050 is selected to mask clock pulses by forcing the gated clock enable signal (Clk_en) waveform 521 to zero according to the output 1051 of the programmable Boolean function generator 1050.

For example, the output 1051 of the programmable Boolean function generator 1050 may be a combinational function of a plurality of counter bits. In one example, the programmable Boolean function generator 1050 may ramp (e.g., modulate) the gated clock enable signal (Clk_en) waveform 521 according to a Boolean function. In one example, B=6. That is:

gated clock enable signal (Clk_en) waveform 521=
AND [(clock enable signal (Clk_en) waveform 520), (!counter[0]+counter[5]]

In one aspect, the output clock (Clk_out) waveform 540 starts with a frequency of zero, increases to 50% and ends with the output clock (Clk_out) waveform 540 fully enabled at 100%. The gated clock enable signal (Clk_en) waveform 521 may stabilize to a fixed enabled state once the counter 1030 reaches a certain state. For example, if B=6 and the example programmable Boolean function generator 1050 is used, the gated clock enable signal (Clk_en) waveform 521 may stabilize to a fixed enabled state once the counter 1030 reaches a state of 32. Also, in this example, the output clock (Clk_out) waveform 540 duty cycle is not 50%. Although in the example of FIG. 10, a programmable Boolean function generator is used, a fixed Boolean function generator may be used within the spirit and scope of the present disclosure.

In one aspect, the Boolean function may be based on latency-criticality of the internal wakeup events (e.g., waits for interrupt (WFI), wait for event (WFE), snoop, etc.). For example, a shorter clock frequency ramp may be implemented in response to snoops while a longer clock frequency ramp may be implemented for WFI or WFE.

In another example, the Boolean function may be based on the quantity of active processor cores. That is, if a single processor core is active, the clock frequency may ramp more quickly than if more processor cores are active.

In another example, the Boolean function may be based on the dynamic clock and frequency scaling (DCFS) point of the processor cores. For example, in super turbo mode, a longer clock frequency ramp is implemented. In a lower frequency mode, a shorter clock frequency ramp is implemented. That is, for example, at higher frequencies (e.g., super turbo mode) the duration of the Boolean function may be N=32 to allow a longer clock frequency ramp. At lower frequencies the duration of the Boolean function may be N=24 to allow a shorter clock frequency ramp which may be acceptable from a power supply noise standpoint.

In one example, one of the external events (e.g., glitch-free multiplexer change, power management change, software interrupt, etc.) may indicate the ramp status of other processor cores. For example, perform a shorter clock frequency ramp if the other processor cores are already at full clock frequency. Or, perform a longer clock frequency ramp if multiple processor cores are turn ON simultaneously.

Figure 11:
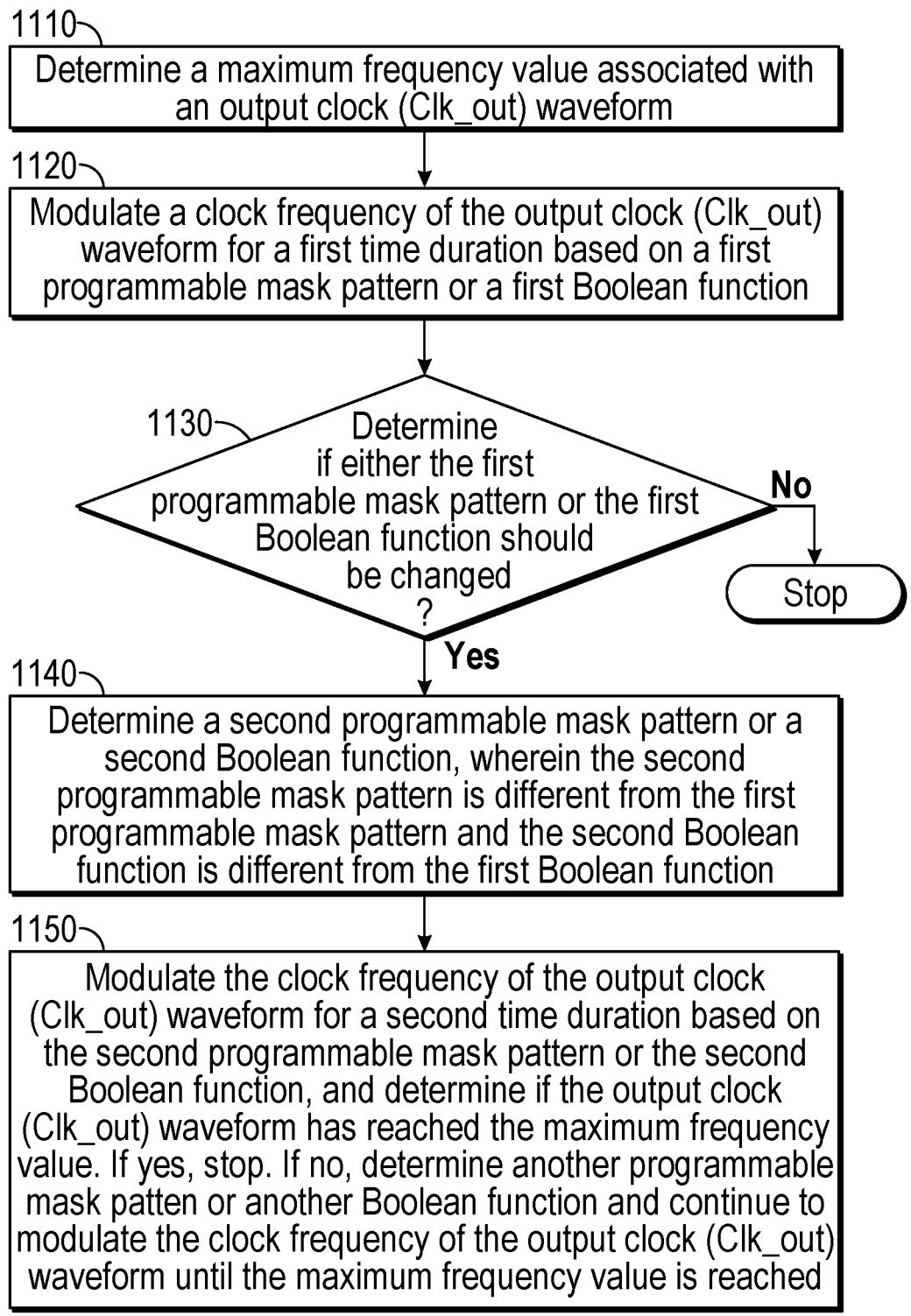
FIG. 11 illustrates an example flow diagram 1100 for reducing clock-ungating induced voltage droop.

FIG. 11 illustrates an example flow diagram 1100 for reducing clock-ungating induced voltage droop. In block 1110, determine a maximum frequency value associated with an output clock (Clk_out) waveform. In one example, the maximum frequency may be based on operating specifications of one or more electronic components of a voltage droop mitigation circuit.

In block 1120, modulate a clock frequency of the output clock (Clk_out) waveform for a first time duration based on a first programmable mask pattern or a first Boolean function.

In block 1130, determine if either the first programmable mask pattern or the first Boolean function should be changed. If yes, proceed to block 1140. If no, stop. In one example, the first programmable mask pattern or the first Boolean function should not be changed if the output clock (Clk_out) waveform has reached the maximum frequency value. In one example, the determination is based on whether the clock frequency has reached the maximum frequency value. In another example, the determination is based on internal wakeup events (e.g., wait for interrupt (WFI), wait for event (WFE), snoop, etc.). In another example, the determination is based on external events (e.g., glitch-free multiplexer change, power management change, software interrupt, etc.). In another example, the determination is based on the quantity of active processor cores within a digital circuitry that includes the voltage droop mitigation circuit. That is, if a single processor core is active, the clock frequency may ramp (e.g., modulate) more quickly than if more processor cores are active. In another example, the determination is based on the dynamic clock and frequency scaling (DCFS) point of one or more of the processor cores.

In block 1140, determine a second programmable mask pattern or a second Boolean function, wherein the second programmable mask pattern is different from the first programmable mask pattern and the second Boolean function is different from the first Boolean function.

In block 1150, modulate the clock frequency of the output clock (Clk_out) waveform for a second time duration based on the second programmable mask pattern or the second Boolean function, and determine if the output clock (Clk_out) waveform has reached the maximum frequency value. If yes, stop. If no, determine another programmable mask pattern or another Boolean function and continue to modulate the clock frequency of the output clock (Clk_out) waveform until the maximum frequency value is reached.

In one example, the second programmable mask pattern or the second Boolean function may implement a longer clock frequency ramp. In another example, the second programmable mask pattern or the second Boolean function may implement a shorter clock frequency ramp. Whether a longer clock frequency ramp or a shorter clock frequency ramp is implemented may depend on whether there is a critical event for the clock frequency ramp behavior. If there is no critical event, then the second programmable mask pattern or the second Boolean function is to implement a longer clock frequency ramp. If there is a critical event, then the second programmable mask pattern or the second Boolean function is to implement a shorter clock frequency ramp. For example, if the critical event is that the maximum frequency value must be reached quickly, then the second programmable mask pattern or the second Boolean function is to implement the shorter clock frequency ramp. Additionally, there may be a determination of the quantity of processor cores that are active to determine if the shorter clock frequency ramp is to be implemented.

In one example, the longer clock frequency ramp will operate at a frequency value that is less than 50% of the maximum frequency value. In one example, the shorter clock frequency ramp will operate at a frequency value that is greater than 50% of the maximum frequency value. In one example, the programmable mask patterns (e.g., the first programmable mask pattern, the second programmable mask pattern, etc.) and/or the Boolean functions (the first Boolean function, the second Boolean function, etc.) may be generated by an analytic model which determines clock frequency ramps and its associated voltage droops. The analytic model may include models for other components of the digital circuitry and their clock frequency behavior of the other components.

In one aspect, the steps of FIG. 11 may be executed by any of the voltage droop mitigation circuits disclosed herein, for example, in FIGS. 6, 7 and/or 10. In one aspect, one or more of the steps of FIG. 11 may be executed by one or more processors which may include hardware, software, firmware, etc. In one aspect, one or more of the steps in FIG. 11 may be executed by one or more processors which may include hardware, software, firmware, etc. The one or more processors, for example, may be used to execute software or firmware needed to perform the steps in the flow diagram of FIG. 11. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for reducing clock-ungating induced voltage droop. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for reducing clock-ungating induced voltage droop, the method comprising:
   using one or more external events to determine a maximum frequency value, wherein the maximum frequency value is associated with an output clock waveform;
   modifying a clock frequency of the output clock waveform for a first time duration to generate a first modified clock frequency of the output clock waveform, wherein the first time duration is associated with a first Boolean function, wherein the first modified clock frequency is used for the reducing clock-ungating induced voltage droop in a circuit, and wherein the first modified clock frequency of the output clock waveform is different from the maximum frequency value; and
   determining if the first Boolean function should be changed.

2. The method of claim 1, further comprising determining a second Boolean function, wherein the second Boolean function is different from the first Boolean function.

3. The method of claim 2, further comprising modifying the first modified clock frequency of the output clock waveform for a second time duration to generate a second modified clock frequency of the output clock waveform, wherein the second time duration is associated with the second Boolean function.

4. The method of claim 3, further comprising determining if the output clock waveform has reached the maximum frequency value.

5. The method of claim 4, wherein the maximum frequency value is based on one or more operating specifications of one or more electronic components of a voltage droop mitigation circuit.

6. The method of claim 1, wherein the determining if the first Boolean function should be changed is based on whether the first modified clock frequency has reached the maximum frequency value.

7. The method of claim 1, wherein the determining if the first Boolean function should be changed is based on an internal wakeup event.

8. The method of claim 7, wherein the internal event is one of a wait for interrupt (WFI) event, a wait for event (WFE) event, or a snoop event.

9. The method of claim 1, wherein the determining if the first Boolean function should be changed is based on an external event.

10. The method of claim 9, wherein the external event is one of a glitch-free multiplexer change event, a power management change event, or a software interrupt event.

11. The method of claim 1, wherein the determining if the first Boolean function should be changed is based on a quantity of active processor cores within the circuit.

12. The method of claim 11, wherein the determining if the first Boolean function should be changed is based on a dynamic clock and frequency scaling (DCFS) point of one or more of the quantity of active processor cores.

* * * * *